United States Patent
Jin et al.

(10) Patent No.: US 10,217,921 B2
(45) Date of Patent: Feb. 26, 2019

(54) DISPLAY APPARATUS

(71) Applicant: SAMSUNG ELECTRONICS CO., LTD., Suwon-si (KR)

(72) Inventors: Su-hwan Jin, Suwon-si (KR); Hyun-taek Na, Suwon-si (KR); Dae-hyun Nam, Anyang-si (KR); Dae-yeon Yun, Seoul (KR); Jeong-il Kang, Yongin-si (KR); Jin-hyun Cho, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 305 days.

(21) Appl. No.: 15/079,241

(22) Filed: Mar. 24, 2016

(65) Prior Publication Data

US 2016/0329478 A1   Nov. 10, 2016

(30) Foreign Application Priority Data

May 7, 2015   (KR) .................. 10-2015-0064038

(51) Int. Cl.
*H01L 35/32*     (2006.01)
*F21V 29/74*     (2015.01)
(Continued)

(52) U.S. Cl.
CPC .............. *H01L 35/32* (2013.01); *F21V 29/74* (2015.01); *G09G 5/00* (2013.01); *H01L 35/30* (2013.01); *G09G 2330/023* (2013.01)

(58) Field of Classification Search
CPC . H01L 35/32; G09G 2330/023; G02B 6/0085
(Continued)

(56) References Cited

U.S. PATENT DOCUMENTS 6,122,185 A  *  9/2000  Utsunomiya .......... G04C 10/00
                                                  363/60
7,731,377 B2 *  6/2010  Moriya ............. G02F 1/133603
                                                  362/231
(Continued)

FOREIGN PATENT DOCUMENTS

JP    2004-319658 A    11/2004
KR    2000-0073211 A   12/2000
(Continued)

OTHER PUBLICATIONS

Communication dated Sep. 26, 2016 issued by the European Patent Office in counterpart European Patent Application No. 16158582.3.
(Continued)

*Primary Examiner* — Julie Bannan
(74) *Attorney, Agent, or Firm* — Sughrue Mion, PLLC

(57) ABSTRACT

A display apparatus is provided. The display apparatus includes a display panel, a chassis configured to support the display panel, a backlight unit configured to be installed on the chassis, and an electricity generator configured to use the backlight unit as a heat source to generate electricity. The electricity generator includes a heat transfer unit which contacts the backlight unit, at least one heat storage unit which contacts the heat transfer unit, and at least one thermoelectric device comprising a heat generator and a heat absorber contacting the heat transfer unit. The at least one thermoelectric device absorbs heat, which is generated from the backlight unit, through the heat transfer unit in response to the backlight unit being driven and absorbs heat from the at least one heat storage unit through the heat transfer unit in response to the backlight unit not being driven.

20 Claims, 10 Drawing Sheets

(51) Int. Cl.
    *H01L 35/30* (2006.01)
    *G09G 5/00* (2006.01)
(58) Field of Classification Search
    USPC .................................................. 136/200–240
    See application file for complete search history.

(56) References Cited

U.S. PATENT DOCUMENTS

| | | | |
|---|---|---|---|
| 2005/0088588 A1* | 4/2005 | Lee .......................... | F21V 29/00 349/65 |
| 2006/0219284 A1* | 10/2006 | Horio ...................... | H01L 35/30 136/205 |
| 2009/0096957 A1* | 4/2009 | Hiyama ................. | G02B 6/003 349/65 |
| 2011/0096569 A1* | 4/2011 | Hamada ............... | G02B 6/0085 362/613 |
| 2013/0139524 A1* | 6/2013 | Kim ........................ | F25B 21/02 62/3.7 |
| 2014/0252531 A1 | 9/2014 | Aryan et al. | |
| 2015/0075186 A1* | 3/2015 | Prajapati ................... | G06F 1/20 62/3.7 |
| 2015/0192729 A1* | 7/2015 | Hosoki ............. | G02F 1/133308 348/794 |
| 2016/0133814 A1* | 5/2016 | Ghoshal .................. | H01L 35/32 136/205 |
| 2016/0149107 A1* | 5/2016 | Cheng ..................... | H01L 35/32 136/205 |
| 2017/0005147 A1* | 1/2017 | Lee ..................... | H01L 27/3225 |

FOREIGN PATENT DOCUMENTS

| | | |
|---|---|---|
| KR | 10-2005-0049666 A | 5/2005 |
| KR | 10-1391159 B1 | 5/2014 |
| WO | 2014084897 A2 | 6/2014 |

OTHER PUBLICATIONS

Communication dated Dec. 6, 2018 issued by the European Patent Office in counterpart European Application No. 16 158 582.3.

* cited by examiner

DISPLAY APPARATUS

CROSS-REFERENCE TO RELATED APPLICATIONS

This application claims priority from Korean Patent Application No. 10-2015-0064038, filed on May 7, 2015, in the Korean Intellectual Property Office, the disclosure of which is incorporated herein by reference in its entirety.

BACKGROUND

1. Field

Apparatuses and methods consistent with exemplary embodiments of the present disclosure relate to a display apparatus, and more particularly, to a display apparatus including an electric generator using a thermoelectric device.

2. Description of the Related Art

Regulations on power consumption of electronic products have been recently tightened around the world. As a result, energy harvesting technologies have received attention. Energy harvesting refers to a technology that harvests and stores otherwise abandoned energy, converts the abandoned energy into useful energy, and uses the useful energy. Energy harvesting technologies are generally classified into piezoelectric energy generating technologies, which harvest and store mechanical energy, and thermoelectric energy generating technologies, which harvest and store heat energy. Some of the thermoelectric generating technologies utilizing a Seebeck effect that is a principle of generating an electromotive force through a temperature difference between opposite ends of a device. Some electric generators utilizing the Seebeck effect do not include dynamic parts and directly convert heat into energy in a material, such as a thermoelectric device or the like, without requiring fuel. As a result, these electric generators may be highly stable and environmentally-friendly. Technologies that reduce power consumption of an electronic product when the electronic product is turned on using an energy harvesting technology have been actively studied.

However, electronic products including recently produced display apparatuses are designed to exchange data with other electronic products through a British Telecommunications (BT) module, a Wi-Fi module, or the like, update weather information, check user mobile contents, or perform Internet of Things (IoT) functions even when the electronic products are turned off. Therefore, power consumption of an electronic product, i.e., an amount of standby power of the electronic product, increases in a standby mode that is a power-off state. Also, worldwide regulations on power consumption have been expanded and strengthened to include regulations on standby power.

Therefore, there is a need for a method of reducing power consumption of an electronic product when the electronic product is turned on and reducing standby power consumption of the electronic apparatus even when the electronic product is turned off.

SUMMARY

Exemplary embodiments of the present disclosure overcome the above-described disadvantages as well as other disadvantages not described herein. Also, an exemplary embodiment of the present disclosure is not required to overcome the disadvantages described above, and an exemplary embodiment of the present disclosure may not overcome any of the problems described above.

The present disclosure provides an electric generator for storing heat, which is generated by an electronic product when the electronic product is turned on, i.e., driven, in a phase change material (PCM) to supply a thermoelectric device with the heat stored in the PCM when the electronic product is turned off, i.e., not driven, so as to generate electric energy to a display apparatus including the electric generator.

According to an aspect of an exemplary embodiment, there is provided a display apparatus including a display panel, a chassis configured to support the display panel, a backlight unit configured to emit light to the display panel, and an electric generator configured to use the backlight unit as a heat source so as to generate electricity. The electric generator may include a heat transfer unit, at least one heat storage unit, and at least one thermoelectric device. The backlight unit may be in contact with a first surface of the heat transfer unit, and the at least one heat storage unit and the at least one thermoelectric device may be in contact with a second surface of the heat transfer unit. The at least one thermoelectric device may absorb heat generated from the backlight unit through the heat transfer unit in response to the backlight unit being driven and absorb heat from the at least one heat storage unit through the heat transfer unit in response to the backlight unit not being driven.

The first surface of the heat transfer unit may be located opposite of the second surface of the heat transfer unit.

The at least one thermoelectric device may be disposed adjacent to the at least one heat storage unit.

The at least one thermoelectric device may contact a portion of the second surface of the heat transfer unit which corresponds to a portion of the first surface of the heat transfer unit with which the backlight unit may be in contact.

The at least one thermoelectric device may comprise a heat absorber and a heat generator, The display apparatus may further include a heat radiation member in contact the with heat generator of the at least one thermoelectric device.

The heat radiation member may be formed as a heat sink having cooling fins.

The heat generator of the at least one thermoelectric device may contact the chassis.

The at least one thermoelectric device and the at least one heat storage unit may be housed in a portion of the chassis.

The at least one heat storage unit is insulated from the chassis and the at least one thermoelectric device by at least one insulator.

The heat transfer unit may be a sheet formed of metal or graphite.

According to another aspect of the present disclosure, a display apparatus includes a display panel, a chassis configured to support the display panel, a backlight unit configured to emit light to the display panel, and an electric generator configured to use the backlight unit as a heat source to generate electricity. The electric generator may include a heat transfer unit, at least one heat storage unit, and at least one thermoelectric device. The backlight unit may be in contact with a first surface of the heat transfer unit, a first surface of the chassis may be in contact with a second surface of the heat transfer unit, and the at least one heat storage unit and the at least one thermoelectric device may be in contact with a second surface of the chassis. The at least one thermoelectric device may absorb heat through the heat transfer unit and the chassis in response to the backlight unit being driven and absorb heat from the at least one heat storage unit through the heat transfer unit and the chassis in response to the back light unit not being driven.

The first surface of the heat transfer unit may be located opposite of the second surface of the heat transfer unit.

The first surface of the chassis may be located opposite of the second surface of the chassis.

The at least one thermoelectric device may comprise a heat absorber and a heat generator.

The display apparatus may further include a heat radiation member in contact with the heat generator of the at least one thermoelectric device.

The heat radiation member may be formed as a heat sink having cooling fins.

The at least one heat storage unit may be substantially encompassed within an insulator.

The heat transfer unit may be a sheet formed of metal or graphite.

According to another aspect of the present disclosure, a method of providing electric energy to a display apparatus which may include a display panel, a chassis configured to support the display panel, a backlight unit configured to emit light to the display panel, and an electric generator configured to use the backlight unit as a heat source to generate electricity, wherein the electric generator may comprise a heat transfer unit, at least one heat storage unit, and at least one thermoelectric device, may comprise the steps of: when the backlight unit is being driven, transferring heat energy from the backlight unit to the at least one heat storage unit and the at least one thermoelectric device through the heat transfer unit; when the backlight unit is not being driven, transferring heat energy from the at least one heat storage unit to the at least one thermoelectric device through the heat transfer unit; and generating electric energy from the heat energy transferred to the at least one thermoelectric device.

The above and other aspects and advantages of the present disclosure will be set forth in part in the description which follows and, in part, will be obvious from the description, or may be learned by practice of the present disclosure.

BRIEF DESCRIPTION OF THE DRAWINGS

The above and/or other aspects of the present disclosure will be more apparent by describing certain exemplary embodiments of the present disclosure with reference to the accompanying drawings, in which.

DETAILED DESCRIPTION OF EXEMPLARY EMBODIMENTS

Figure 1:
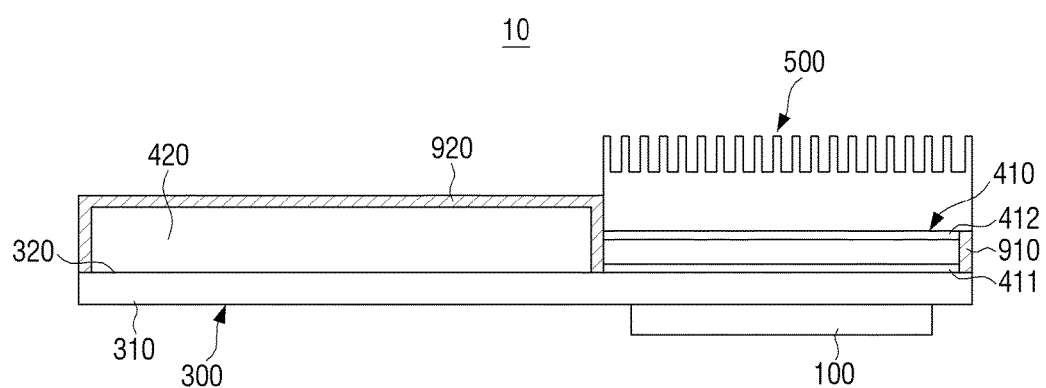
FIG. 1 is a schematic cross-sectional view of an electric generator according to an exemplary embodiment.

Certain exemplary embodiments of the present disclosure will now be described in greater detail with reference to the accompanying drawings.

In the following description, same drawing reference characters are used for the same elements even in different drawings. The matters defined in the description, such as detailed construction and elements, are provided to assist in a comprehensive understanding of the present disclosure. Thus, it is apparent that the exemplary embodiments of the present disclosure can be carried out without those specifically defined matters. Also, well-known functions or constructions are generally not described in detail since they would obscure the present disclosure with unnecessary detail.

FIG. 1 is a schematic cross-sectional view of an electric generator 10 according to an exemplary embodiment of the present disclosure. Referring to FIG. 1, the electric generator 10 is a device that harvests and stores heat energy and converts the stored heat energy into electric energy. The electric generator 10 may include a heat source 100, a heat transfer unit 300, at least one thermoelectric device 410, at least one heat storage unit 420, at least one insulator, and a heat radiation member 500.

The heat source 100 may be any appropriate heat-producing device or part or component thereof. For example, the heat source 100 may be a part or component of various types of semiconductor devices, including those of a driver circuit unit including a driver integrated circuit (IC), etc. for driving various types of electronic devices. The heat source 100 may additionally or alternatively be a part or component of various types of electronic devices that radiate heat, such as one or more light source units of various types of electronic devices. As will be described in more detail below, the heat source 100 may be disposed to contact a first surface 310 of the heat transfer unit 300.

The heat transfer unit 300 may include the first surface 310 and a second surface 320 that is located opposite of the first surface 310. The heat transfer unit 300 may be disposed such that the first surface 310 contacts the heat source 100, and such that the second surface 320 contacts the thermoelectric device 410 and the heat storage unit 420. In some embodiments, the heat transfer unit 300 may be formed in a substantially flat shape but is not limited thereto. In fact, the heat transfer unit 300 may be formed in various appropriate shapes. And, in some embodiments, the heat transfer unit 300 may be formed according to a shape of the heat source 100. The heat transfer unit 300 may absorb heat energy from the heat source 100 through the first surface 310 and exchange heat energy with the thermoelectric device 410 and the heat storage unit 420 through the second surface 320. The heat transfer unit 300 may be formed of a material having a high heat conductivity to minimize loss of heat energy during the process of transferring and exchanging heat energy. For example, among other materials, the heat transfer unit 300 may be formed of one or a combination of aluminum (Al), copper (Cu), a porous foam material, a graphite sheet, or the like. In those embodiments in which a graphite sheet is used, the graphite sheet may have a heat conductivity between 800 W/mK and 1200 W/mK based on a thickness of 0.01 mm. The above-described materials of the heat transfer unit 300 are merely examples, and thus the heat transfer unit 300 is not limited thereto and may be formed of various types of materials. In addition, the heat transfer unit 300 may be substantially insulated to minimize loss of heat energy during the process of transferring and exchanging heat energy.

The thermoelectric device 410 may include a heat absorber 411 that absorbs heat energy from the heat transfer unit 300, a heat generator 412 that emits the absorbed heat energy, and N-type and P-type semiconductors that are disposed between the heat absorber 411 and the heat generator 412.

The thermoelectric device 410 may be disposed such that the heat absorber 411 contacts the second surface 320 of the heat transfer unit 300. In some embodiments, the thermoelectric device 410 may be disposed substantially opposite of the heat source 100 to increase the transfer and exchange of heat energy from the heat source 100 to the thermoelectric device 410. That is, in some embodiments, the thermoelectric device 410 may be disposed to contact a portion of the second surface 320 of the heat transfer unit 300 that corresponds to a portion of the first surface 310 of the heat transfer unit 300 with which the heat source 100 is in contact. According to this configuration, a distance between the thermoelectric device 410 and the heat source 100 may be reduced thereby decreasing heat loss and increasing the amount of heat energy that is transferred and exchanged from the heat source 100 to the thermoelectric device 410.

The thermoelectric device 410 may absorb heat energy transferred to the thermoelectric device 410 through the heat absorber 411, which is in contact with the second surface 320 of the heat transfer unit 300. The thermoelectric device 410 may produce electric energy by emitting the absorbed heat energy through the heat generator 412. If a constant temperature difference is maintained between the heat absorber 411 and the heat generator 412, the thermoelectric device 410 may consistently produce electric energy. For example, if a temperature difference between the heat absorber 411 and the heat generator 412 is maintained at about 40° C., the thermoelectric device 410 may consistently output approximately 85 mW based on the thermoelectric device 410 having the dimensions of 12 mm×8 mm×1.65 mm. However, in some embodiments, it may be difficult to maintain a temperature of the heat generator 412 relative to a temperature of the heat absorber 411. For example, it may be difficult to prevent the temperature of the heat generator 412 from increasing relative to the temperature of the heat absorber 411. As a result, the temperature of the heat absorber 411 and the temperature of the heat generator 412 may converge thereby reducing a temperature difference between the temperature of the heat absorber 411 and the temperature of the heat generator 412. Consequently, a desired amount of electric energy may not generated. As will be described in more detail below, to assist in maintaining the temperature of the heat generator 412, the heat radiation member 500 may be attached to the heat generator 412 of the thermoelectric device 410 to assist in the dissipation of heat.

The heat storage unit 420 may be formed of a phase change material (PCM) that may store heat energy. As discussed above, the heat storage unit 420 may be disposed to contact the second surface 320 of the heat transfer unit 300.

The heat transfer unit 300 may likewise be formed of a PCM that may store heat energy. If a temperature of the PCM forming the heat transfer unit 300 increases to a point equal to or above a phase-change temperature of the PCM, the PCM may absorb and accumulate heat energy, i.e., latent energy, as the PCM changes from solid to liquid or liquid to gas. If the temperature of the PCM decreases to a point equal to or below a phase-change temperature of the PCM, the PCM may release stored heat energy, i.e., latent energy, as the PCM changes from liquid to solid or gas to liquid. Among other materials, a paraffin-based material such as a paraffin wax may be used as the PCM. Paraffin wax has a melting point lower than 55° C. and latent heat of about 173,000 J/Kg accompanying a phase change. The PCM is not limited to a paraffin-based material, however, and other various types of PCMs, such as fatty acid-based PCMs, ester-based PCMs, etc., may be used.

As discussed above, the heat storage unit 420 may be disposed to contact the second surface 320 of the heat transfer unit 300. The heat storage unit 420 may further be disposed adjacent to the thermoelectric device 410 to thereby reduce a distance between the thermoelectric device 410 and the heat storage unit 420. Heat energy generated by the heat source 100 may be preferentially transferred to the thermoelectric device 410 through the second surface 320 of the heat transfer unit 300 due to the reduced distance between the thermoelectric device 410 and the heat source 100 as discussed above. Heat energy that is not transferred to the thermoelectric device 410 may be transferred to the heat storage unit 420 through the second surface 320 of the heat transfer unit 300. If the heat source 100 is removed, or if a sufficient amount of heat energy is not generated by the heat source 100, heat energy may be transferred from the heat storage unit 420 to the thermoelectric device 410. According to this configuration, given the reduced distance between the thermoelectric device 410 and the heat storage unit 420, heat loss may be decreased and the amount of heat energy that is transferred and exchanged may be increased from the heat storage unit 420 to the thermoelectric device 410.

In some embodiments, in order to increase the efficiency with which heat is stored within the heat storage unit 420, the heat storage unit 420 may be insulated except for a portion of the heat storage unit 420 that is in contact with the second surface 320 of the heat transfer unit 300. As a result, the heat storage unit 420 may be insulated from external air to thereby decrease heat loss. The heat storage unit 420 may further to be insulated from the thermoelectric device 410, including the heat generator 412. As a result, because the heat storage unit 420 does not transfer heat energy directly to the heat generator 412 of the thermoelectric device 410, a temperature of the heat generator 412 may be more effectively maintained and the heat generator 412 of the thermoelectric device 410 may release heat energy more efficiently.

The insulator may include a first insulator 910 and a second insulator 920. As shown in FIG. 1, the first insulator 910 and the second insulator 920 may substantially encompass the thermoelectric device 410 except for the heat generator 412 and the heat absorber 411. In addition, the second insulator 920 may substantially encompass the heat storage unit 420 except for a portion of the heat storage unit 420 that is in contact with the second surface 320 of the heat transfer unit 300.

The heat radiation member 500 may be disposed to contact the heat generator 412 of the thermoelectric device 410. The heat radiation member 500 may be formed of a material having a high heat conductivity. The heat radiation member 500 may be formed in the shape of a heat sink having cooling fins as shown in FIG. 1 but is not limited thereto. For example, the heat radiation member 500 may be formed as various types of members, such as a heat radiation pad, a heat radiation sheet, etc., that may perform cooling functions. These cooling fins may increase an exposed surface area of the heat radiation member 500 such that the heat radiation member 500 may more efficiently dissipate heat.

Hereinafter, an exemplary situation in which the heat source 100 generates heat energy, an exemplary situation in which the heat source 100 is removed or does not generate a sufficient amount of heat energy, and exemplary transfer paths of heat energy in an electric generator having the above-described structure will be describe with reference to FIGS. 2 and 3.

Figure 2:
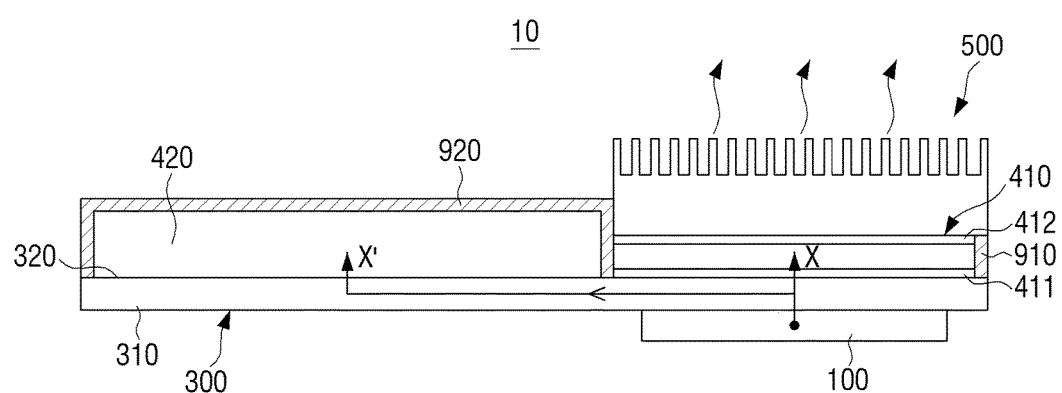
FIG. 2 is a schematic cross-sectional view of the electric generator of FIG. 1 illustrating a heat transfer path from a heat source of the electric generator to a thermoelectric device and a heat storage unit of the electric generator.

FIG. 2 illustrates an exemplary situation in which the heat source 100 generates heat energy. In addition, FIG. 2 illustrates a heat transfer path from the heat source 100 to the thermoelectric device 410 and the heat storage unit 420 of the electric generator 10 of FIG. 1.

Referring to FIG. 2, if the heat source 100, which contacts the first surface 310 of the heat transfer unit 300, begins to emit heat energy, a considerable portion of the heat energy is transferred as shown according to an arrow X to the thermoelectric device 410 through the heat absorber 411 of the thermoelectric device 410 due to the reduced distance between the thermoelectric device 410 and the heat source 100 as discussed above. The heat energy that is transferred through the heat absorber 411 of the thermoelectric device 410 is converted into electric energy when the heat energy is emitted through the heat generator 412 of the thermoelectric device 410. As discussed above, the first insulator 910 and the second insulator 920 may substantially encompass the thermoelectric device 410 except for the heat generator 412 and the heat absorber 411 to thereby decrease heat loss and increase efficiency.

A portion of the heat energy generated by the heat source 100 is transferred to, and stored within, the heat storage unit 420 as shown according to an arrow X'. As heat energy is transferred to the heat storage unit 420, a temperature of the heat storage unit 420, which is formed of a PCM as discussed above, gradually increases and reaches a phase-change temperature at which the PCM changes from a solid state to a liquid state or from a liquid state to a gaseous state so as to absorb heat energy, i.e., latent heat. During the phase change, e.g., as the solid PCM is melting, the temperature of the heat storage unit 420 remains substantially constant. The heat storage unit 420 absorbs and stores latent heat, i.e., heat energy, until the phase change process is completed. Once the phase change is complete, e.g., the solid PCM has melted, the temperature of the heat storage unit 420 may increase in response to the continued transfer of heat energy.

In this embodiment, although the temperature of the heat storage unit 420 may increase as discussed above, and although the heat storage unit 420 is disposed adjacent to the thermoelectric device 410, the heat storage unit 420 is insulated from the thermoelectric device 410. As a result, heat energy may not be transferred from the heat storage unit 420 to the heat generator 412 of the thermoelectric device 410. As such, the emission of heat energy from the thermoelectric device 410 is not interrupted.

Figure 3:
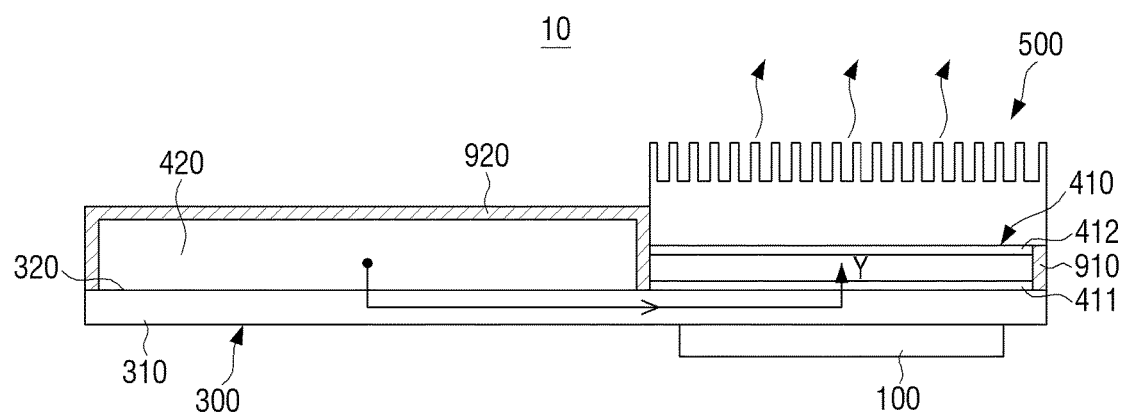
FIG. 3 is a schematic cross-sectional view of the electric generator of FIG. 1 illustrating a heat transfer path from the heat storage unit of FIG. 2 to the thermoelectric device of FIG. 2.

FIG. 3 illustrates an exemplary situation in which the heat source 100 is removed or does not generate a sufficient amount of heat energy. In addition, FIG. 3 illustrates a heat transfer path from the heat storage unit 420 to the thermoelectric device 410 of the electric generator of FIG. 1.

It should be appreciated that because no heat energy will be transferred to the heat transfer unit 300 in either situation where the heat source 100 does not generate a sufficient amount of heat energy or where the heat source 100 has been removed, the discussion below is generally applicable to either situation.

Although heat energy is not transferred from the heat source 100, the thermoelectric device 410 continues to emit heat energy through the heat generator 412. As a result, a temperature of the thermoelectric device 410 decreases. Further, as the temperature of the thermoelectric device 410 decreases, a temperature of the heat transfer unit 300, with which the thermoelectric device 410 is in contact, also decreases. As a result, a temperature gradient may occur between a portion of the second surface 320 of the heat transfer unit 300 with which the thermoelectric device 410 is in contact and a portion of the second surface 320 of the heat transfer unit 300 with which the heat storage unit 420 is in contact. This temperature gradient may cause heat energy to be transferred from the heat storage unit 420 to the thermoelectric device 410 through the heat transfer unit 300.

In this situation, the heat storage unit 420 emits heat energy to the heat transfer unit 300 as shown according to an arrow Y. A considerable portion of the heat energy emitted to the heat transfer unit 300 is transferred to the thermoelectric device 410 as shown according to the arrow Y due to the reduced distance between the thermoelectric device 410 and the heat storage unit 420 as discussed above. Also as discussed above, the heat transfer unit 300 may be substantially insulated except for those portions of the heat transfer unit 300 that are in contact with the thermoelectric device 410, the heat storage unit 420, and/or the heat source 100. As a result, a considerable amount of the heat energy transferred from the heat storage unit 420 is transferred to the thermoelectric device 410.

As the heat storage unit 420 emits heat energy, a temperature of the heat storage unit 420, which is formed of a PCM as discussed above, gradually decreases and reaches a phase-change temperature at which the PCM changes from a liquid state to a solid state or from a gaseous state to a liquid state so as to emit heat energy, i.e., latent heat. During the phase change, e.g., as the liquid PCM is solidifying, the temperature of the heat storage unit 420 remains substantially constant. The heat storage unit 420 emits stored latent heat, i.e., heat energy, until the phase change process is completed. Once the phase change is complete, e.g., the liquid PCM has solidified, the temperature of the heat storage unit 420 may decrease in response to the continued emission of heat energy.

Once the phase change of the PCM due to emission of heat energy is complete as discussed above, the temperature of the heat storage unit 420 may decrease to a temperature substantially equal to a temperature of the thermoelectric device 410.

As the thermoelectric device 410 continuously absorbs heat energy transferred from the heat storage unit 420 through the heat absorber 411, a temperature of the heat absorber 411 remains substantially constant. As a result, a temperature difference between the heat absorber 411 and the heat generator 412 is generally maintained. As such, the thermoelectric device 410 may consistently generate a required amount of electric energy.

Hereinafter, a display apparatus 1 including an electric generator 20 according to another exemplary embodiment will be described with reference to FIGS. 4-6. It should be appreciated that descriptions of the same or similar elements of the present exemplary embodiment as those of the previous exemplary embodiment are generally omitted.

Figure 4:
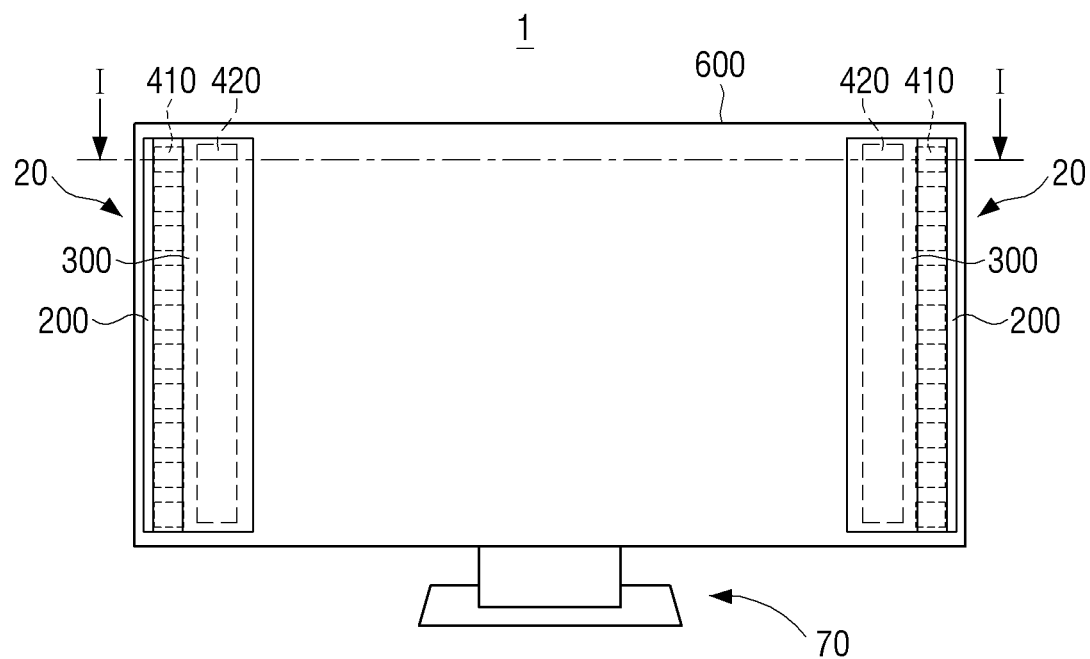
FIG. 4 is a schematic cross-sectional view of a display apparatus including an electric generator according to an exemplary embodiment.

FIG. 4 is a schematic cross-sectional view of the display apparatus 1 including the electric generator 20 according to another exemplary embodiment of the present disclosure. FIG. 5 is a cross-sectional view taken along line I-I of FIG. 4. FIG. 6 is an enlarged view of part VI of FIG. 5.

Referring to FIG. 4, the display apparatus 1, including the electric generator 20 according to the present exemplary embodiment, may include a display panel, a chassis, a backlight unit, a stand unit 70, and the electric generator 20. The display apparatus 1 may be a flat panel display such as a plasma display panel (PDP) television (TV), a liquid crystal display (LCD) TV, a light-emitting diode (LED) TV, an organic light-emitting diode (OLED) TV, or the like. The display apparatus 1 is not limited to use as a TV. For example, the display apparatus may be used a computer monitor or the like.

The display panel may be a PDP panel, an LCD panel, an LED panel, an OLED panel, or the like and may be included in a corresponding display apparatus.

The chassis forms a space that houses components of the display apparatus 1 such as the display panel, a driver circuit unit including a driver IC, etc. for driving the display panel, a backlight unit, etc. The chassis may include a lower chassis 600. The lower chassis 600 may be disposed to contact the electric generator 20 as will be described in more detail below.

The backlight unit is disposed on a back surface of the display panel and includes a light source unit 200 that emits light to the display panel. The light source unit 200 may be formed as an LED bar that extends downwardly from an upper part of the lower chassis 600.

The stand unit 70 is coupled with a lower part of the chassis to support the display apparatus 1. If the display apparatus 1 is fixed to a wall, the stand unit 70 may be separated from the chassis and omitted. As such, the stand unit 70 may be coupled with the lower part of the chassis in a manner such that the stand unit 70 may be easily separated from the chassis.

A pair of electric generators 20 according to the present exemplary embodiment may be disposed on front surfaces of both sides of the lower chassis 600 and attached thereto. Each electric generator 20 of the pair of electric generators 20 may include a heat source, a heat transfer unit, at least one thermoelectric device 410, at least one heat storage unit 420, and at least one insulator. However, unlike the previous exemplary embodiment discussed above, a heat radiation member is not included. It should be appreciated, however, that a heat radiation member may be included in the electric generator 20 of the present exemplary embodiment.

The heat source may be the light source unit 200, i.e., the LED bar of the backlight unit.

The heat storage unit 420 and the thermoelectric device 410 may be disposed adjacent to one another on a front surface of the lower chassis 600. The heat storage unit 420 and the thermoelectric device 410 may be oriented vertically and parallel to one another. For example, the thermoelectric device 410 and the heat storage unit 420 may be formed in single plate shapes that extend vertically and may be disposed adjacent to one another.

The heat transfer unit 300 may be formed in a single plate shape that extends vertically. As best seen in FIG. 5, the heat transfer unit 300 may be disposed between the LED bar of the backlight unit, and the thermoelectric device 410 and the heat storage unit 420.

The electric generator 20 according to the present exemplary embodiment will now be described in more detail with reference to FIGS. 5 and 6.

Figure 5:
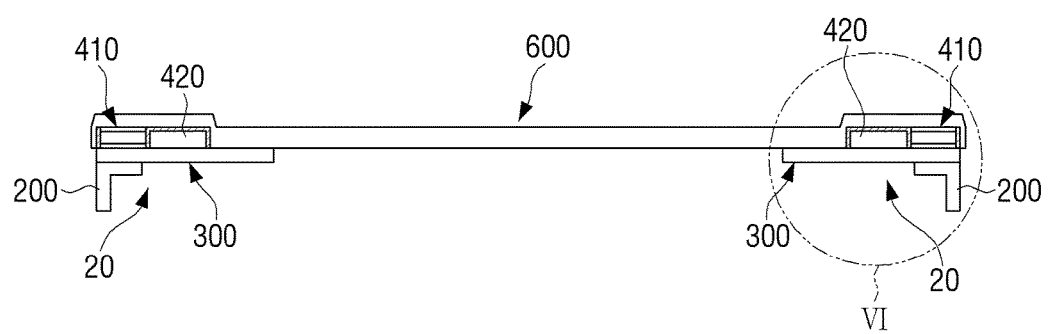
FIG. 5 is a cross-sectional view of the display apparatus of FIG. 4 taken along line I-I of FIG. 4.
Figure 6:
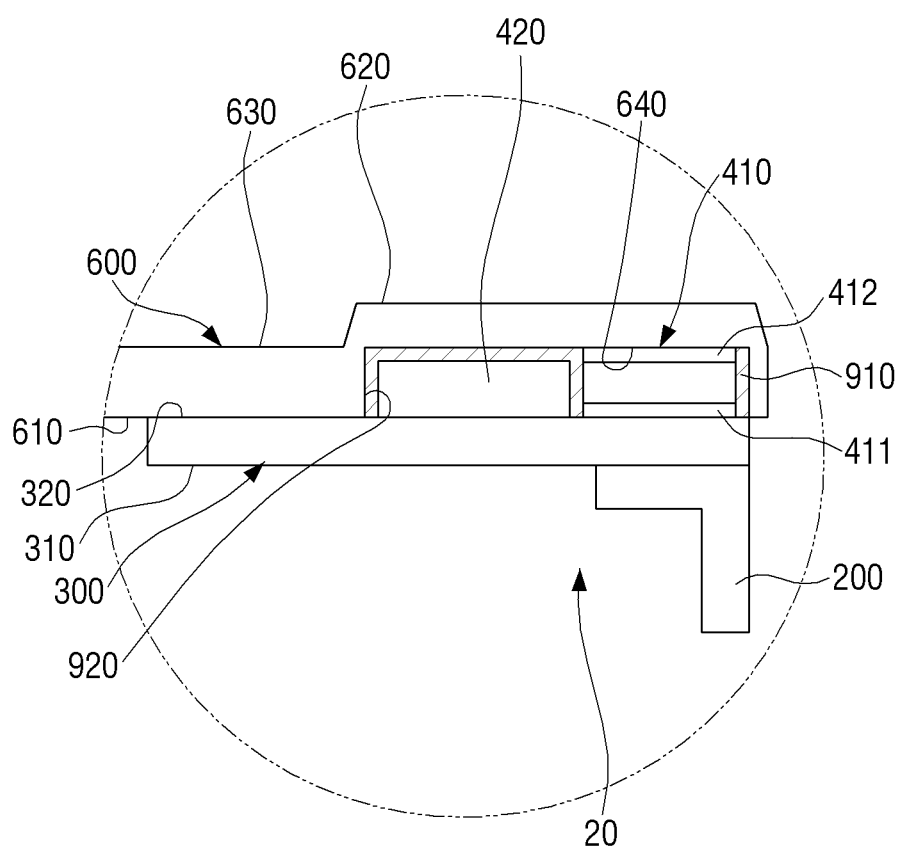
FIG. 6 is an enlarged view of part VI of FIG. 5 of the display apparatus of FIG. 4.

Referring to FIGS. 5 and 6, the first surface 310 of the heat transfer unit 300 may contact the LED bar of the backlight unit, and the second surface 320 of the heat transfer unit 300 may contact the at least one thermoelectric device 410, the at least one heat storage unit 420, and a first surface 610 of the lower chassis 600. As a result, the heat transfer unit 300 may absorb heat energy emitted from the LED bar of the backlight unit and transfer the heat energy to the thermoelectric device 410, the heat storage unit 420, and the lower chassis 600 to thereby maintain a reliable temperature of the LED bar of the backlight unit. For example, the temperature of the LED bar of the backlight unit that may be maintained at about 80° C. A portion of the heat transfer unit 300 that is exposed may be insulated by the insulator to increase efficiency of heat energy transferred and exchanged from the heat storage unit 420 to the thermoelectric device 410.

The lower chassis 600 may include the first surface 610 that faces a front surface of the lower chassis 600, and a second surface 620 and a third surface 630 each located opposite of the first surface 610.

The first surface 610 may include a housing groove 640 formed into both sides of the lower chassis 600. The second surface 620 may be formed in a location corresponding to the housing groove 640 and may form a step difference with the third surface 630.

The housing groove 640 may be formed to house the thermoelectric device 410 and the heat storage unit 420. The heat generator 412 of the thermoelectric device 410 may contact an internal surface of the housing groove 640 formed in the lower chassis 600. As a result, the thermoelectric device 410 may transfer heat energy, which is absorbed through the heat absorber 411, to the lower chassis 600 through the heat generator 412. The lower chassis 600 may absorb heat energy, which is enough to maintain a temperature of the heat generator 412 of the thermoelectric device 410 at or below a predetermined temperature, from the thermoelectric device 410. The heat energy absorbed by the lower chassis 600 may be radiated through the second surface 620 and the third surface 630. In addition, the heat energy absorbed by the lower chassis 600 may be radiated through the step difference formed between the second surface 620 and the third surface 630. As a result, the lower chassis 600 may effectively radiate absorbed heat energy.

The first insulator 910 and the second insulator 920 may substantially encompass the thermoelectric device 410 except for the heat generator 412 and the heat absorber 411. In addition, the second insulator 920 may substantially encompass the heat storage unit 420 except for a portion of the heat storage unit 420 that is in contact with the second surface 320 of the heat transfer unit 300.

If the light source unit 200, which is the heat source, generates heat energy, the at least one thermoelectric device 410 and the at least one heat storage unit 420 may absorb heat energy transferred through the heat transfer unit 300. The at least one thermoelectric device 410 may emit absorbed heat energy to the lower chassis 600 through the heat generator 412 as discussed above. Also as discussed above, the first insulator 910 and the second insulator 920 may substantially encompass the thermoelectric device 410 except for the heat generator 412 and the heat absorber 411. As a result, heat energy may not be absorbed or emitted from the thermoelectric device 410 except through the heat absorber 411 and the heat generator 412. The lower chassis 600 may absorb heat energy transferred through the heat transfer unit 300 and the heat generator 412 of the thermoelectric device 410 and emit the absorbed heat energy into external air.

If the light source unit 200, which is the heat source, does not generate a sufficient amount of heat energy, the at least one thermoelectric device 410 may absorb heat energy transferred from the at least one heat storage unit 420 through the heat transfer unit 300 as discussed above. Also as discussed above, the second insulator 920 may substantially encompass the heat storage unit 420 except for a portion of the heat storage unit 420 that is in contact with the second surface 320 of the heat transfer unit 300. As a result, the efficiency of heat energy transferred from the heat storage unit 420 to the thermoelectric device 410 may be increased.

Electric generators 30 and 40 according to exemplary embodiments of the present disclosure will now be described with reference to FIGS. 7A and 7B. It should be appreciated that descriptions of the same or similar elements of the present exemplary embodiments as those of the previous exemplary embodiments are generally omitted.

Figure 7A:
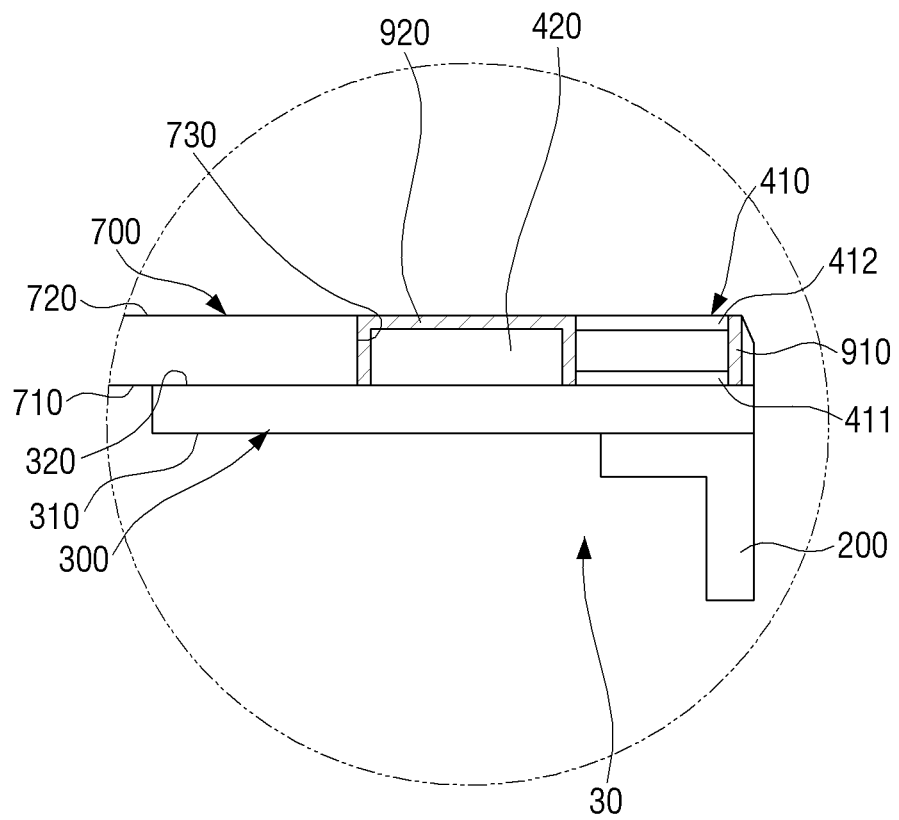
FIGS. 7A and 7B are partially enlarged views of electric generators according to exemplary embodiments.
Figure 7B:
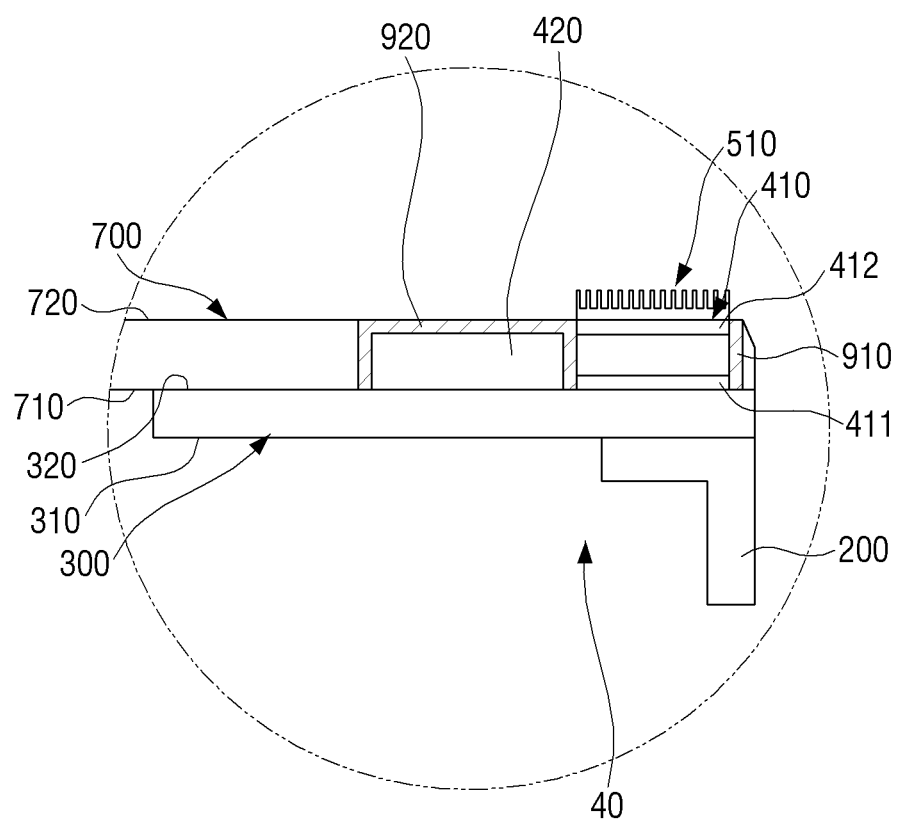

FIGS. 7A and 7B are enlarged views of the electric generators 30 and 40 according to exemplary embodiments of the present disclosure.

Referring to FIG. 7A, the electric generator 30 according to an exemplary embodiment may include the heat transfer unit 300 that includes the first surface 310 contacting the LED bar of the backlight unit and the second surface 320 contacting the at least one thermoelectric device 410, the at least one heat storage unit 420, and a first surface 710 of a lower chassis 700. A portion of the heat transfer unit 300 that is exposed to external air may be insulated by an insulator. As a result, the heat transfer unit 300 may increase transfer efficiency of heat energy from the heat storage unit 420 to the thermoelectric device 410.

The lower chassis 700 may include the first surface 710 that faces a front surface of the lower chassis 700 and a second surface 720 that is located opposite of the first surface 710. A through hole 730 may be formed through the lower chassis 700 to connect the first surface 710 and the second surface 720. The through hole 730 is formed such that the thermoelectric device 410 and the heat storage unit 420 may be housed therein, i.e., inserted into a portion of the lower chassis 700. Therefore, the heat generator 412 of the thermoelectric device 410 may be exposed to external air, and the thermoelectric device 410 may transfer heat energy, which is absorbed through the heat absorber 411, to external air through the heat generator 412.

If the light source unit 200, which is the heat source, generates heat energy, the thermoelectric device 410 and the heat storage unit 420 may absorb heat energy transferred through the heat transfer unit 300. The thermoelectric device 410 may emit heat energy through the heat generator 412 to external air and not directly to the lower chassis 700 as in the previous embodiment. The lower chassis 700, however, may absorb heat energy transferred through the heat transfer unit 300 to emit the absorbed heat energy into external air.

If the light source unit 200, which is the heat source, does not generate a sufficient amount of heat energy, heat energy that is transferred from the heat storage unit 420 through the heat transfer unit 300 may be absorbed through the heat absorber 411 as discussed above.

Referring to FIG. 7B, the electric generator 40 according to another exemplary embodiment may further include a heat radiation member 510 that contacts the heat generator 412 of the thermoelectric device 410. The heat radiation member 510 may be formed in the shape of a heat sink having cooling fins but is not limited thereto. For example, the heat radiation member 510 may be formed as various types of members, such as a heat radiation pad, a heat radiation sheet, etc., that may perform cooling functions. As a result, the thermoelectric device 410 may consistently and efficiently emit heat energy, which is absorbed from the heat absorber 411, through the heat generator 412.

Hereinafter, electric generators 50 and 60 according to exemplary embodiments of the present disclosure will be described with reference to FIGS. 8A and 8B. It should be appreciated that descriptions of the same or similar elements of the present exemplary embodiments as those of the previous exemplary embodiments are generally omitted.

Figure 8A:
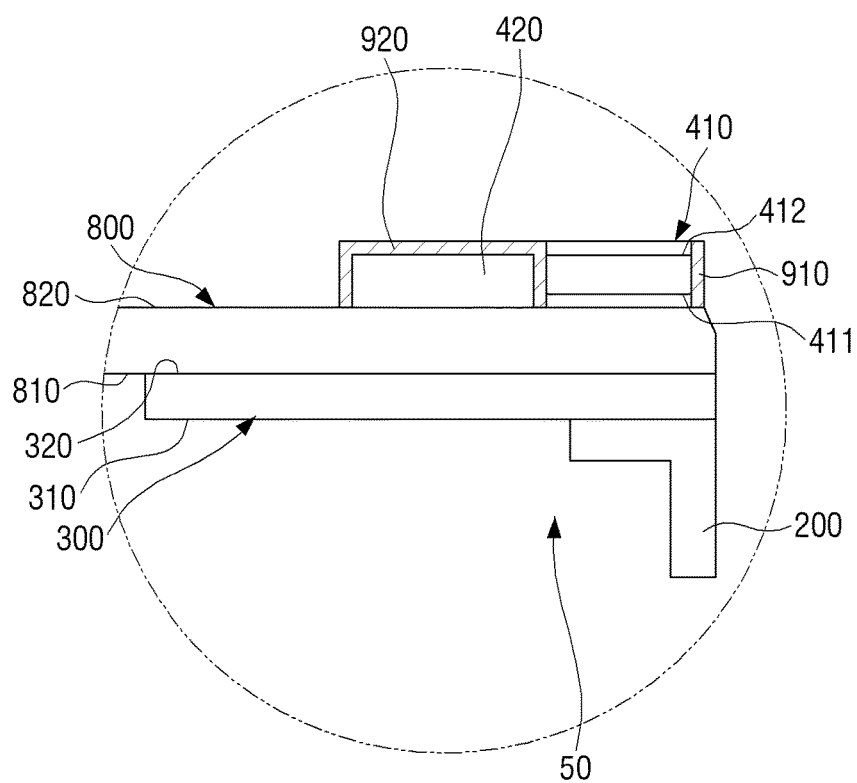
FIGS. 8A and 8B are partially enlarged views of electric generators according to exemplary embodiments.
Figure 8B:
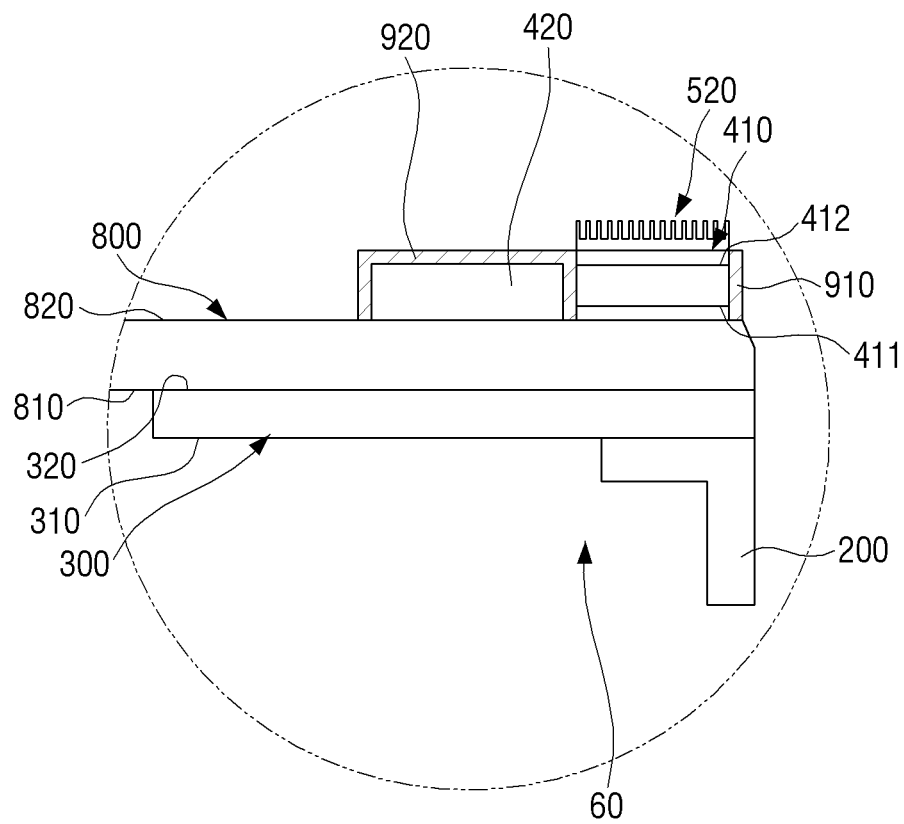

FIGS. 8A and 8B are enlarged views of the electric generators 50 and 60 according to exemplary embodiments of the present disclosure.

Referring to FIG. 8A, in the electric generator 50, the first surface 310 of the heat transfer unit 300 contacts the LED bar of the backlight unit, and the second surface 320 of the heat transfer unit 300 contacts a first surface 810 of a lower chassis 800.

The lower chassis 800 may include the first surface 810 and a second surface 820 that is located opposite of the first surface 810. The lower chassis 800 is disposed between the thermoelectric device 410 and the heat storage unit 420, and the heat transfer unit 300 to thereby separate the heat transfer unit 300 from the thermoelectric device 410 and the heat storage unit 420.

The heat transfer unit 300 may be disposed to contact the first surface 810 of the lower chassis 800. The heat absorber 411 of the thermoelectric device 410 and the heat storage unit 420 may be disposed to contact the second surface 820 of the lower chassis 800.

If the light source unit 200, which is the heat source, generates heat energy, the thermoelectric device 410 and the heat storage unit 420 may absorb heat energy, which is transferred through the heat transfer unit 300 and the lower chassis 800.

If the light source unit 200, which is the heat source, does not generate a sufficient amount of heat energy, heat energy that is stored in the heat transfer unit 300 and/or the heat storage unit 420 may be transferred to the thermoelectric device 410 and the heat storage unit 420 through the lower chassis 800 and the heat transfer unit 300, and the thermoelectric device 410 may absorb heat energy transferred through the heat absorber 411.

Referring to FIG. 8B, the electric generator 60 according to another exemplary embodiment may further include a heat radiation member 520 that contacts the heat generator 412 of the thermoelectric device 410. The heat radiation member 520 may be formed in the shape of a heat sink having air cooling fins but is not limited thereto. For example, the heat radiation member 520 may be formed as various types of members, such as a heat radiation pad, a heat radiation sheet, etc., that may perform cooling functions. As a result, the thermoelectric device 410 may consistently and efficiently emit heat energy, which is absorbed from the heat absorber 411, through the heat generator 412.

The foregoing exemplary embodiments and advantages are merely exemplary and are not to be construed as limiting the present disclosure. The present teachings can be readily applied to other types of apparatuses. Also, the description of the exemplary embodiments of the present disclosure is intended to be illustrative, and not to limit the scope of the claims, and many alternatives, modifications, and variations will be apparent to those skilled in the art.

What is claimed is:
1. A display apparatus comprising:
   a display panel;
   a chassis configured to support the display panel;
   a backlight unit configured to emit light to the display panel; and an electric generator configured to convert heat generated by the backlight unit to electricity, the electric generator comprising:
 at least one thermoelectric device;
 at least one heat storage unit; and
 a heat transfer unit comprising:
  a first surface in direct contact with the backlight unit to exchange heat therebetween; and
  a second surface in direct contact with the at least one heat storage unit and the at least one thermoelectric device to exchange heat therebetween.

2. The display apparatus of claim 1, wherein the first surface of the heat transfer unit is located opposite of the second surface of the heat transfer unit.

3. The display apparatus of claim 1, wherein the at least one thermoelectric device is disposed adjacent to the at least one heat storage unit.

4. The display apparatus of claim 1, wherein the at least one thermoelectric device contacts a portion of the second surface of the heat transfer unit which corresponds to a portion of the first surface of the heat transfer unit with which the backlight unit is in contact.

5. The display apparatus of claim 1, wherein the at least one thermoelectric device comprises a heat absorber and a heat generator.

6. The display apparatus of claim 5, further comprising:
 a heat radiation member in contact with the heat generator of the at least one thermoelectric device.

7. The display apparatus of claim 6, wherein the heat radiation member is formed as a heat sink having cooling fins.

8. The display apparatus of claim 5, wherein the heat generator of the at least one thermoelectric device is in contact with the chassis.

9. The display apparatus of claim 1, wherein the at least one thermoelectric device and the at least one heat storage unit are housed within a portion of the chassis.

10. The display apparatus of claim 1, wherein the at least one heat storage unit is insulated from the chassis and the at least one thermoelectric device by at least one insulator.

11. The display apparatus of claim 1, wherein the heat transfer unit is a sheet formed of metal or graphite.

12. A display apparatus comprising:
 a display panel;
 a chassis configured to support the display panel, the chassis comprising
  a first surface; and
  a second surface;
 a backlight unit configured to emit light to the display panel; and
 an electric generator configured to convert heat generated by the backlight unit to electricity, the electric generator comprising:
  at least one thermoelectric device in direct contact with the second surface of the chassis to exchange heat therebetween;
  at least one heat storage unit in direct contact with the second surface of the chassis to exchange heat therebetween; and
  a heat transfer unit comprising:
   a first surface in direct contact with the backlight unit to exchange heat therebetween; and
   a second surface in direct contact with the first surface of the chassis to exchange heat therebetween.

13. The display apparatus of claim 12, wherein the first surface of the heat transfer unit is located opposite of the second surface of the heat transfer unit.

14. The display apparatus of claim 12, wherein the first surface of the chassis is located opposite of the second surface of the chassis.

15. The display apparatus of claim 12, wherein the at least one thermoelectric device comprises a heat absorber and a heat generator.

16. The display apparatus of claim 15, further comprising:
 a heat radiation member in contact with the heat generator of the at least one thermoelectric device.

17. The display apparatus of claim 16, wherein the heat radiation member is formed as a heat sink having cooling fins.

18. The display apparatus of claim 14, wherein the at least one heat storage unit is substantially encompassed within an insulator.

19. The display apparatus of claim 14, wherein the heat transfer unit is a sheet formed of metal or graphite.

20. A method of providing electricity to a display apparatus, the display apparatus comprising a display panel, a chassis configured to support the display panel, a backlight unit configured to emit light to the display panel, and an electric generator configured to convert heat generated by the backlight unit to electricity, wherein the electric generator comprises at least one heat storage unit, at least one thermoelectric device, and a heat transfer unit comprising a first surface in direct contact with the backlight unit to exchange heat therebetween, and a second surface in direct contact with the at least one heat storage unit and the at least one thermoelectric device to exchange heat therebetween, the method comprising:
 generating heat energy, using the backlight unit;
 dissipating heat energy from the backlight unit through the heat transfer unit to the at least one thermoelectric device and the at least one heat storage unit;
 storing heat energy within the at least one heat storage unit;
 dissipating heat energy from the at least one heat storage unit to the at least one thermoelectric device; and
 converting the heat energy to electricity, using the at least one thermoelectric device.

* * * * *